United States Patent [19]

Rosette et al.

[11] 4,171,400

[45] Oct. 16, 1979

[54] SHAPED PRESS-FORGED NORMALLY FRANGIBLE INORGANIC CRYSTALS

[75] Inventors: King H. Rosette, Chagrin Falls; Herbert Packer, Cleveland Heights, both of Ohio

[73] Assignee: The Harshaw Chemical Company, Cleveland, Ohio

[21] Appl. No.: 875,317

[22] Filed: Feb. 6, 1978

Related U.S. Application Data

[63] Continuation of Ser. No. 649,247, Jan. 15, 1976, abandoned, which is a continuation-in-part of Ser. No. 307,939, Nov. 20, 1972, Pat. No. 3,933,970.

[51] Int. Cl.$^2$ .................. G02B 5/00; G02C 7/00
[52] U.S. Cl. .................... 428/357; 252/300; 264/1; 264/320; 350/1.1; 350/319; 423/490; 428/212; 428/539
[58] Field of Search .............. 428/212, 357, 538, 539; 350/1, 319; 264/1, 320; 423/490; 252/300

[56] References Cited

U.S. PATENT DOCUMENTS

| | | | |
|---|---|---|---|
| 3,114,601 | 12/1963 | Letter | 350/1 |
| 3,312,759 | 4/1967 | Letter | 264/1 |
| 3,359,066 | 12/1967 | Hatch et al. | 350/1 X |
| 3,365,271 | 1/1968 | Carnall et al. | 350/1 X |
| 3,459,503 | 8/1969 | Roy et al. | 350/1 |
| 3,794,704 | 2/1974 | Strong | 264/1 |
| 3,883,214 | 3/1975 | Hoffman | 350/1 |
| 3,894,795 | 7/1975 | Laurens | 350/319 |
| 4,038,201 | 7/1977 | Hargreaves | 423/490 X |

Primary Examiner—Lorraine T. Kendell
Attorney, Agent, or Firm—Alfred D. Lobo; James A. Lucas

[57] ABSTRACT

A polycrystalline shaped article useful as a light-transmitting body or scintillation phosphor is formed from an essentially moncrystalline melt-grown macrocrystal ingot by pressing the ingot between opposed surfaces with no radial restraint, at a temperature below its melting point and under sufficient pressure to transform the ingot, in situ, into a fully dense, homogeneous, polycrystalline mass of unrestricted width.

A polycrystalline shaped article useful as a light-transmitting and/or light-generating body may also be formed from a fully dense, homogeneous, optically integral polycrystalline mass by pressing the polycrystalline mass between opposed surfaces with no radial constraint, at a temperature below its melting point, but greater than one-half its melting point measured in degrees centigrade, under sufficient pressure to form a relatively larger polycrystalline mass of lesser height.

12 Claims, No Drawings

SHAPED PRESS-FORGED NORMALLY FRANGIBLE INORGANIC CRYSTALS

CROSS-RELATED PATENT APPLICATIONS

This is a continuation of Ser. No. 649,247, and now abandoned, which in turn is a continuation-in-part application of Ser. No. 307,939 filed Nov. 20, 1972, now U.S. Pat. No. 3,933,970.

BACKGROUND OF THE INVENTION

Wherever trace impurities in the order of about one part per million are detrimental, as in a scintillation phosphor, or where it is essential that a fully dense, optically integral crystalline material be formed, as for example in a laser window, no method, other than press-forging a fully dense crystalline mass will suffice. By "fully dense" and "optically integral" we refer to a crystalline material which has essentially the same optical properties as a melt-grown ingot. In particular, an optically integral or fully dense optical crystal characteristically is free of voids large enough to cause appreciable scatter of transmitted radiation, and more specifically, can transmit radiation of short wavelength in the range from about $0.1\mu$ (micron) to about $1\mu$, without any more scatter than a melt-grown single crystal of the same material, in other words, characterized by specular transmission in the short wavelength region, less than $1\mu$. Thus, a polycrystalline article of relatively large diameter may be formed from an ingot of relatively smaller diameter, one being optically indistinguishable from the other, except that one is essentially a single crystal and the other is polycrystalline. In particular, windows may be press-forged which permit the transmittance of laser beams with less than 0.1% absorption, or no more absorption than is displayed by the archetype monocrystalline ingot, sometimes referred to as a macrocrystal, whichever is greater. In addition, press-forged windows are characterized by several times greater strength than that obtained with essentially single crystal ingots. Similarly, optically integral scintillation phosphors may be formed having large diameters which are theoretically not limited by the size of the largest ingot which may be grown. Particularly useful ingots are melt-grown from the ionic salts of the alkali metals and alkaline earth metals, either pure or in solution one with the other; or from the ionic salts of the alkali metals and alkaline earth metals containing minor amounts of dopands which serve either to enhance the optical and scintillation characteristics of the ingot, or its strength, or both.

Single crystals and essentially single crystal ingots are used in a host of applications. For example, windows transparent to radiation in the range from microwave through infrared and ultraviolet radiation are used in instruments of various kinds, including the transmission of laser beams and infrared and ultraviolet light where the crystals are used as domes or windows in missiles and related devices, communication transmission stations and the like. Doped crystals effective as scintillation phosphors are used for the detection of ionizing radiation in conjunction with a photomultiplier tube in devices ranging from simple scintillation counters to sophisticated camera plates for medical use in connection with the analysis of gamma radiation emanating from patients who are injected with specific active isotopes.

In the application mentioned hereinbefore, as well as in many others, shaped articles transparent to the aforementioned wave length range have been limited in size by the peculiar physical properties of ionic crystals. The demanding requirements of windows, domes and lenses large enough for modern commercial and military requirements are antithetical to the well-known size limitation of shaped articles made from optically integral ionic crystals. Relatively large shaped articles have been prepared from hot-pressed powders of calcium fluoride and other alkali metal and alkaline earth metal halides. In addition to finely divided powders of polycrystalline materials in the range from about 20 to about 500 microns, single crystal fragments the average particle size of which ranged from less than 10 microns to several millimeters have also been used. The hot-pressed shaped articles formed have included lenses, windows and the like which are radiation-permeable, though with varying degrees of permeability depending upon the wavelength of radiation. Characteristically, these hot-pressed articles are incapable of transmitting radiation coherently. The deficiency of hot-pressed crystals and powders, formed into articles as described in U.S. Pat. No. 3,359,066 are known to have markedly inferior properties as compared to lenses, domes and windows made from single crystals, or macrocrystal artificially melt-grown ingots. More refined hot-pressed polycrystalline materials, with random orientations of the grains, have been made as disclosed in U.S. Pat. No. 3,453,215. The method includes many purification steps of fine powder which is then hot-pressed into a laser host material. Despite the refinements, these materials are generally not fully dense, that is, they are less dense than a melt-grown ingot and have an unacceptably high absorption coefficient for the transmittance of high-power laser beams in excess of about 1000 watts/cm$^2$.

Macryocrystal ingots are presently grown in sizes up to about 36 inches in diameter and about 1 foot long, wherein individual crystal grains may range in size up to a nominal diameter of about 8 inches or more. Large as these ingots are, they are not large enough; more important, were these ingots large enough, they would not have sufficient strength.

Thus, as of the present time, where a high quality, optically integral shaped article is required, whether it is for use as a scintillation phosphor, laser window, or an infrared or ultraviolet transmitting lens, when a relatively large shaped article is required, several individual single crystal pieces, or sections from a macrocrystal ingot are individually sawed off the melt-grown ingot and then adhesively bonded together to form the larger shaped composite. Notwithstanding the arduous devotion which is a perquisite of successful fabrication of a relatively large shaped article having superior radiation transmission properties, the end result was an article of determined fragility, and transmission properties so marginally superior to those of hot-pressed articles as to negate the use of such relatively large composites for all but those applications where cost is not a factor. Moreover, a composite formed in this manner suffers from the drawbacks of degradation of light output due to the optical interfaces. No matter how carefully the faces of sections are polished before they are bonded into a composite, there is no way of eliminating the undesirable effects of the interface. Particularly in the case of windows for lasers, where it is essential that the radiation be maintained in coherent form, it is impractical to use a composite of macrocrystal sections. Assuming that adjacent macrocrystal sections were cleaved along matching planes, no matter how carefully the faces are polished, there would exist between the faces some macroscopic voids, however small, which would interrupt the transmission of coherent light. If the faces are adhesively bonded, the energy level of the laser to be transmitted would be predicated upon the temperature sensitivity of the energy-absorptive adhesive used. Assuming it is possible to maintain the adhesive at a relatively low temperature, there would still be the problem of matching the refractive index of the adhesive with that of the crystal. The slightest difference in refractive index would generate reflections that would destroy the usefulness of the composite as a laser window.

In pending applications Ser. No. 180,087; 179,787; 139,217 all now abandoned; and 166,725 are described the formation of scintillation phosphors formed as extrudates of unrestricted length and arbitrary cross sections by extrusion of a single crystal or macrocrystal ingot at a temperature below its melting point and under sufficient pressure to form a coherent, homogeneous, fully dense polycrystalline material; stated differently, the shaped polycrystalline scintillation phosphors are formed by a process of extrusion or extruding, defined as: "to shape (as metal, plastic, rubber) by forcing through a specially designed opening often after a previous heating of the material or of the opening or of both" (see Webster's 3rd New International Dictionary, G. & C. Merriam Company, publishers, Springfield, Mass. 1966). In a more technical sense, extrusion is defined as "shaping (metal) into a chosen continuous form by forcing it through a die of appropriate shape" (see Definitions of Metallurgical Terms, p. 6, Metals Handbook, 1946 Edition, published by The American Society for Metals).

Extrusion of normally frangible macrocrystal ingots as disclosed in the aforementioned patent applications, and in the prior art, is effected in a confined zone and is distinct from press-forging as claimed in this invention. For example, it is known that a single crystal billet of sodium chloride may be fitted tightly into an extrusion chamber and forced through an extrusion dye maintained at various temperatures above 300° C. to yield a rod of polycrystalline sodium chloride which is completely clear and free from porosity and therefore, optically integral. (See "Mechanical Properties of Polycrystalline Sodium Chloride" by R. J. Stokes, Proceedings of the British Ceramic Society, Vol. 6, p. 192, June, 1966). This work was done in connection with a study of the mechanical properties of polycrystalline sodium chloride in relation to those of polycrystalline magnesium oxide which has a similar lattice structure but a melting point so high (2650° C.) as to make the direct study of the "more technologically significant material", namely magnesium oxide, all but impossible. This study is not directly related to the press-forged crystals of this invention.

It is also known that an almost completely transparent polycrystalline cesium bromide disk can be made under pressure in a steel mold from a single crystal pressed at 8,000 PSI at 300° C. under vacuum, heated to 400° C. and then cooled to 100° C. while being maintained under pressure. The single crystal was maintained in a confined mold, under radial constraint, presumably to ensure the formation of a disk without fractures. The reported study entitled "The Mechanical Behavior of Single Crystal and Polycrystalline Cesium Bromide" by L. D. Johnson and J. A. Pask, J. Am. Ceram. Soc., 47, 9, 437–444, 1964, was undertaken because CsBr has an interpenetrating simple cubic structure rather than an interpenetrating face-centered cubic structure characteristic of rock salt or lithium fluoride. The authors reported that single crystals of cesium bromide were found to be "soft" and ductile if they were favorably oriented relative to the loading axis to activate the 110 slip systems. There is no indication that any deformation of the single crystal was effected. Neither is there any indication that if there was any deformation, that the deformation of the crystal was effected without fracture, or, whether any fracture that occurred was reconstituted or 'healed' under the particular conditions of temperature, pressure and constraint. Having formed an almost completely transparent polycrystalline disk from a monocrystalline disk in a confined mold, the authors studied the polycrystalline structure so formed and stated "Because of the lack of 5 independent slip systems for this crystal structure, general plastic deformation of polycrystalline cesium bromide cannot occur without formation of voids or gaps between the grains unless some other deformation mechanism can operate. Kinking, the only other possible mechanism observed, required considerably higher stress levels than were attained in these specimens" (bottom of p. 443). It is hypothesized that the lack of radial constraint in the press-forged crystals of this invention provides the basis for the 'some other deformation mechanism' which permits total optical integrity and transparency, rather than almost complete transparency, whether the starting material is an essentially single macrocrystal ingot or a polycrystalline mass. This unexpected transparency or unhindered permeability extends not only to light in the infrared, visible and ultraviolet regions where it is greatly desirable, but to high-energy coherent laser beams in excess of 1000 watts/cm$^2$ where it is a necessity.

The polycrystalline nature of a press-forged body is easily recognized by etching the crystal surface so as to show off the fine grain structure of a typically polycrystalline body.

A press-forged optical body may be distinguished from a polycrystalline extrudate, derived from a single crystal ingot, by the clear orientation of the grains along the axis of extrusion of the extrudate, while the press-forged optical body lacks such a characteristic axial grain orientation. A typical press-forged optical body shows crystallites having radially diminishing grain size and the majority of individual crystallites having an orientation radially generally angularly disposed to the direction of force used to form the press-forged body. It should be kept in mind, that the degree of radial orientation and the degree of radially diminishing grain size will probably be obscured by multiple press-forging, particularly if the direction of the applied force is changed.

The major distinction between a press-forged polycrystalline optical body which is optically integral and a hot-pressed body of the same material is the scatter at short wavelengths. There is no argument that well-prepared hot-pressed bodies are optically integral to infrared radiation, but these same bodies show much scatter, or may even be essentially opaque in the short UV range. A second clear distinction between a hot-pressed optical body and a press-forged optical body of this invention is the scatter of a laser beam. A hot-pressed body shows a fuzzy pattern while the press-forged body will show a sharply defined pattern. The more numerous the voids in the hot-pressed body, the greater the fuzziness of the pattern.

Distinguishing a press-forged optical body derived from an extrudate may be difficult depending upon whether or not the press-forging direction coincides with the axis of extrusion, the time and temperature over which the press-forging is effective, and the extent of the compressive deformation. Generally, any extrudate which has been press-forged will exhibit, by its grain structure, that the orientation of the grains along the axis of extrusion has been interfered with. Though a clearly radial and angular orientation of the grains with respect to the axis of force application during press-forging may not be evident, it would be apparent to the practiced eye, that the optical body is not one that has been extruded only.

Certain ceramic materials such as spinel crystals, magnesium oxide, calcium oxide and titanium carbide have been forged under extreme pressure and temperature conditions, as described in "Deformation, Recrystallization, Strength, and Fracture of Press-Forged Ceramic crystals" by Roy W. Rice in the Jour. of the American Ceramic Soc., Vol. 55, No. 2 pages 90–97. The gist of the article is that these ceramic crystals can be press-forged, that they evidence a polycrystalline structure when they are press-forged, that they have a tendency to recrystallize, and that despite generally similar behavior, it is difficult to predict performance characteristics of one material though armed with knowledge of performance characteristics of a similar material. There is a conspicuous absence of any reference herein that the ceramic crystals behave in an analogous manner compared with similarly structured lattices of ionic salts, and specifically, halides.

The work most closely related to our invention is described in "Preparation of Polycrystalline Alkali Halides by high-temperature deformation of Single Crystals" by V. Traskin, Z. Skvortsova, et al. (see Soviet Physics-Crystallography, Vol. 15, No. 4, Jan-Feb. 1971). It teaches a two-stage forging method which "comprises plastic deformation of single crystals at an elevated temperature, followed by recrystallization annealing". It more specifically states that single crystals of potassium fluoride were mounted between parallel plane faces of a press, heated to 400° C., and "upset" under a load of 700 kg. to give relatively thin tablets about 6 mm. thick. The furnace was then removed while leaving the sample under the load; when it had cooled down to 300° C. (after about three minutes), the load was increased to 1200 kg. to complete the deformation of this sample, the thickness of which decreased to about 4–4.5 mm. The load was taken off after about ten minutes when the sample had cooled to 150° C.

The rate at which the load was applied is not stated and it cannot be determined whether or not the single crystal was fractured during the initial upsetting stage at the end of which a "tablet" was assumed to have been formed. The tablet was then permitted to cool to 300° C. under load and, in a second stage, the load was increased at the 300° C. temperature, which is below one-half the melting point of the potassium chloride crystal used by them. Small samples obtained showed no appreciable turbidity, but there is little to suggest the unique properties of the press-forged product of this invention.

The difficulty of predicting the effect of press-forging a single crystal, when the conditions are not well-defined, is exemplified in U.S. Pat. No. 3,794,704 to J. D. Strong where it is taught that the forging of a single crystal, which starts as a single crystal, also ends as a single crystal.

SUMMARY OF THE INVENTION

It has been discovered that a normally frangible inorganic single crystal, or melt-grown essentially monocrystalline macrocrystal ingot, may be press-forged, without introducing a fracture, between opposed surfaces with no radial constraint. This press-forging of a melt-grown crystal ingot, is defined as comprising simultaneously maintaining an unconfined but gradually diminishing annular zone between the opposed surfaces, and pressingly deforming the crystal at a temperature below the melting point of the ingot, but above one-half its melting point, measured in degrees centigrade, under sufficient pressure so as to effect a complete transformation of the essentially monocrystalline ingot to a polycrystalline, optically integral, solid having the same density.

It has also been discovered that an optically integral, fully dense, first polycrystalline mass, produced by extrusion from a melt-grown essentially monocrystalline macrocrystal ingot, may be press-forged in a manner analogous to that for press-forging an essentially single crystal ingot, to form a second polycrystalline mass of relatively larger cross-section than the first.

The melt-grown crystals of the instant invention include the ionic salts of the alkali metals and the alkaline earth metals and particularly the halides thereof. The ionic salts may be pure single salts, or solutions of one in another. For use as a scintillation phosphor, a pure single salt may be doped with an activator, as for example, cesium iodide doped with thallium.

A polycrystalline, press-forged window, no less transparent than the essentially single crystal, normally frangible alkali metal halide and/or alkaline earth metal halide, most unexpectedly permits transmittance of a highpower laser beam in excess of 1000 watts/cm$^2$, with less than 0.1 percent absorption, or no more absorption than that exhibited by the original or archetype essentially monocrystalline ingot. A laser window press-forged from the aforementioned halides, or an alloy of one halide and another, may additionally be doped with minor quantities, in the range from about 1 part per million to about 10 mole percent, of a dopand which does not materially diminish the transmittance of a beam of coherent light, but significantly increases the strength of the window.

A shaped, press-forged normally frangible optical body of the instant invention characteristically displays crystallites which are not random in orientation even after two successive general deformations, each having a deformation ratio greater than 1.5. After having undergone a general deformation, the orientation of the crystallites or grains is angularly disposed to the direction of the deformation force. Moreover, the size of grains in the central portion of the press-forged mass is substantially greater than the size of grains near the periphery which unexpectedly provides the press-forged mass with greater strength near its boundaries, where the strength is most desirable. This size graduation, diminishing radially outwards, is easily discernible in an essentially pure alkali metal halide or alkaline earth metal halide single crystal ingot which has been press-forged. However, where a relatively high level of dopand, in excess of about 100 ppm, is present, the radially diminishing grain size is less apparent because the presence of the dopand has been found generally to decrease the size of all the grains or crystallites in the polycrystalline mass.

PREFERRED EMBODIMENT OF THE INVENTION

The simplest forging operation is upsetting, which may be carried out, for the purposes of this invention, by compressing an essentially single macrocrystal ingot or optically integral polycrystalline body between two flat parallel platens and working the body. From this simple operation, the process can be developed into more complicated geometries with the use of dies. A number of variables are involved in forging a normally frangible crystal; among the major variables are properties of the particular macrocrystal, the die materials, temperature, friction, speed of deformation, die geometry, the deformation ratio and dimensions of the work piece. Since in practice, forgeability is normally related to the material's strength, ductility and frictional characteristics, and since normally frangible essentially monocrystalline materials generally have, under ordinary room temperature, little strength, no ductility and unpredictable frictional characteristics that may vary over a wide range, it is unexpected and surprising that such a crystalline body may be press-forged into any desirable shape without cleaving and with no loss of transmittance.

Normally frangible melt-grown essentially single macrocrystal ingots of the ionic salts of alkali metals and alkaline earth metals are particularly adaped to being press-forged into optically integral fully dense polycrystalline bodies. Shaped press-forged crystals of the instant invention are specifically directed to applications where extremely high optical quality is mandatory, such as in the formation of laser windows and scintillation phosphors. Press-forged crystals have higher optical quality than those formed by prior hotpressed polycrystalline optical materials of the same composition. In fact, optical integrity which permits essentially 100 percent transmittance of a laser beam is possible since no trace impurities and no voids are introduced into the crystal. Optical integrity achieved by a polycrystalline press-forged crystal is defined as that characterized by absorption of less than 0.1 percent of a laser beam of 1000 watts/cm$^2$ power, or no more than the absorption of an essentially monocrystalline window formed of the same composition, whichever is greater. This characteristic is of the utmost importance, since it is well-known that, without single crystal optical quality, a practical window for high power lasers, namely those in excess of 1000 watts/cm$^2$, would be out of the question.

Because of the excellent optical properties of the press-forged crystals, large scintillation phosphors usable as camera plates and other radiation detector windows may be made which are optically indistinguishable from a single crystal window. Similarly, large camera lenses, transparent to infrared and ultraviolet rays, may be easily fabricated without the enormous effort involved in prior art hotpressing processes which, despite an extensive purification procedure before hotpressing the purified fine powder, are incapable of providing essentially the same transmittance as a single crystal. Moreover, a press-forged polycrystal of the instant invention is uniformly of the same density as the ingot from which the polycrystal is derived (considered to be 100 percent theoretical density), completely transparent and therefore optically integral in the true sense of the term.

The term polycrystalline as used with reference to a press-forged crystal refers in general to a crystalline material in which, for a sample 1 centimeter thick, the plane orientation as evidenced by X-ray diffraction may or may not be random, depending upon the history of the crystalline mass prior to being press-forged. Where the starting crystal to be press-forged is a polycrystalline extrudate, it will be found that the extrudate is formed of linearly oriented crystals, the direction of orientation being such that the crystallites or individual grains are aligned in such a way that a particular crystallographic direction in each grain is parallel to the extruding direction. For example, a preferred orientation of cubic crystallites in a longitudinal extrusion results in an orientation of the crystallites in a 100 direction with the linear axis parallel to the 100 direction. When such an extruded polycrystalline material is press-forged, a compressive force being exerted in the longitudinal direction of the extrusion, the orientation of the crystallites after press-forging indicates that the orientation is not random but angularly disposed relative to the direction in which the compressive force is exerted. Where the ionic crystal to be press-forged is an essentially single macrocrystal ingot, the direction of orientation of the crystallites in the press-forged polycrystalline material is not random, but angularly disposed relative to the direction of compressive force during press-forging as well as to the particular orientation of the ingot while it is being press-forged. It will be appreciated, that with multiple press-forgings, starting with a very thick crystal, whether it be essentially monocrystalline or polycrystalline, plural deformations by press-forging will tend to obfuscate the history of the press-forged polycrystalline material, particularly if it is to be determined solely from X-ray diffractions indicating the general orientation of the crystallites. Crystals or grains in a polycrystalline mass are usually referred to as crystallites to distinguish from very large single crystals which may constitute an essentially monocrystalline melt-grown ingot.

As has already been indicated, the grain size of an article formed by press-forging a macrocrystal will derive from the conditions of press-forging and the characteristics of the material. These conditions may be chosen to give a grain size as small as 10$\mu$ near the periphery of certain doped alkali metal fluorides; or, to give a grain size as large as 1 cm. near the center of certain alkaline earth metal fluorides.

It is essential that a crystal be worked while it is undergoing a general deformation, if it is to be successfully press-forged. By this is meant that the deformation of the crystal while being press-forged is not restricted to a particular plane of orientation, but occurs in all planes without exhibiting any fractures or intergranular voids which would interfere with the essentially 100 percent transmittance of, or exhibit more than 0.1 percent absorption with, a high-power laser. The extent of working required to provide a general deformation while a crystalline body is press-forged will vary depending upon the physical properties of the body and the particular conditions of press-forging. In general, a deformation ratio of at least 1.5 is required for effecting the necessary transformation of an essentially single crystal to polycrystalline form, or of changing the crystallite orientation of a previously oriented polycrystalline material. By deformation ratio is meant the ratio of the height of the crystal prior to press-forging as compared to the final thickness after it is press-forged.

It will also be appreciated that the orientation of crystallites in press-forged polycrystalline materials will depend to some extent on the peculiar properties of the crystalline itself, since even among normally frangible crystalline materials, several gradations in frangibility exist. Normally frangible crystalline materials are defined as those crystalline materials which normally break, shatter or cleave along cleavage planes when subjected to a compressive force at ambient temperature, that is, under substantially room temperature. Such materials which shatter easily are exemplified by macrocrystal ingots of ionic salts such as the Group I alkali metals exemplified by sodium chloride, and the alkaline earth metals exemplified by magnesium fluoride. These normally frangible materials are distinguished from those which are not, as for example, silver chloride in Group I and mercurous chloride in Group II, each of which has sufficient plasticity to permit the rolling of a single crystal into sheets at ambient temperature conditions without annealing.

Press-forging of inorganic crystals is preferably done on a conventional hydraulic forging press which comprises a hydraulic cylinder supported by two pairs of steel columns which are anchored to a single base casting of great weight and strength. The piston or ram of the cylinder usually points vertically downward and carries the upper forging die which is directly above a stationary anvil die resting on the base casting to which the columns are attached. By admitting a liquid under high pressure to the cylinder at its top, the ram carrying the upper die is forced down upon the material to be forged, which rests upon the lower forging die. Small auxiliary cylinders lift the ram after each application of pressure; additional features, all wellknown, may be utilized depending upon the work to be done by the press, and require no elaboration.

To press-forge a melt-grown ingot or section thereof, the hydraulic press is usually equipped with open dies so that a general deformation of the crystalline mass being press-forged is accomplished without any radial constraint of the mass. The open dies may be any convenient shape, such as dish or bowl shaped, or V-shaped, so as to effect a simple compression of the crystalline mass without initiating any fractures or voids within it. It is essential that the annular region between the dies be open and that the essentially monocrystalline mass be free from radial restraint while it is undergoing a general deformation with a deformation ratio greater than 1.5

In certain instances it may be desirable to confine a portion of the annular zone for the purpose of directing and guiding the flow of a polycrystalline mass being press-forged, since the mass will not usually flow isotropically, that is, at the same rate in all directions. When such guiding of the flow of the deformed polycrystalline mass is practiced the guiding constraint is effective only after the general deformation is essentially complete. In other words, the functioning of the guiding constraint is a "finishing" one; it is both ineffective and unnecessary to reconstitute a crystalline mass which has fractured during press-forging.

Depending upon the composition of the inorganic crystal and its size, and depending upon the temperature at which the forging is effected, the forging press may be required to develop high pressures up to about 10 tons per square inch. The pressure is preferably increased gradually and maintained until the hot crystal yields. In general, both the upper forging die and the lower forging dies are preheated to a suitable temperature so as not to cool the crystal to be press-forged.

The upper temperature limit for the deformation and working of ionic crystals depends upon the composition of the crystal. In general, press-forging is preferably carried out at a safe temperature below the melting point of the particular crystal, but at a temperature above one-half the melting point measured in degrees centigrade.

It is an unexpected and peculiar benefit of the instant invention that press-forged polycrystalline articles formed as disclosed herein, characteristically have crystallites of larger size near the central portion of the deformed polycrystalline mass than near the periphery. The fine grain size near the boundaries of a press-forged mass contributes to the strength of the mass near the edges, where it is a necessity. This characteristic radially diminishing size gradation of grains in a polycrystalline mass is apparent even when a polycrystalline extrudate is press-forged. It will be apparent that after plural deformations, each having a deformation ratio of at least 1.5, the grain size of the press-forged mass becomes so small as to make it difficult to detect the radial gradation in grain size.

The use of a dopand in an alkali metal halide, an alkaline earth metal halide, or a solid solution of one halide in another, depends upon the proposed particular use of the press-forged polycrystalline articles. Factors affecting the choice of dopand and its concentration, are related to the end use of the crystal and are wellknown to those skilled in the art. In general, the level of dopand is less that about 10 mole percent, and most preferably is in the range from about 1 part per million to about 1 mole percent. Where the press-forged polycrystalline article is to be used as a laser window, the dopand is chosen so as not to interfere with the transmittance of the laser beam, and particularly to keep the level of absorption of a high energy laser beam, in excess of 1000 watts/cm$^2$, below about 0.1 percent. The level of a dopand used in the aforementioned press-forged articles is chosen so as to contribute strength of the window without affecting its transmittance.

Where the end use of the article is for a scintillation phosphor, preferred dopands are elements of Group III A of the Periodic Table for example thallium, and elements of the lanthanum series, for example europium. Most preferably, the concentration of dopand in a scintillation crystal is such as to have essentially no measurable effect on the melting point of the pure alkaline metal halide, alkaline earth metal halide, or alloy of one halide and another halide, in which it is dispersed.

For polycrystalline articles used as windows for infrared and ultraviolet light, which windows are completely transparent to radiation in these wave lengths, a dopand may be chosen from Groups I, II, III, IV, V and VII of the Periodic Table. The level of doping is such as not to impair the optical integrity of the window in the sense that there is no noticeable impairment of the essentially perfect optical coupling between the parts of the whole polycrystalline body which provide an infinite number of light paths with essentially the same very high efficiency throughout the integral body. Optical integrity in this true sense, where the light is specularly transmitted from one one surface of the body to another, as in a window, or from a point within the body to a surface of the body, as in a scintillator, is the crucial difference between press-forged articles of the instant invention as compared to hot-pressed prior art articles.

The speed at which press-forging is effected depends upon several factors including the composition of the crystalline material to be press-forged, the melting point of the material the temperature at which the press-forging is to be effected, the size of the crystal to be press-forged and the deformation ratio of the forging. It is critical that no fracture be initiated during press-forging. In general, the closer the press-forging temperature is to the melting point of the crystal, the more quickly the press-forging may be effected. At relatively high temperatures, it is desirable to pressforge as quickly as possible to obtain a relatively fine grain structure for strength. If the temperature is near the melting point, and the rate of compressive deformation is too slow, regrowth of crystals may occur which may adversely affect the strength of the press-forging. As the temperature of press-forging is lowered, the rate at which press-forging may be effected is substantially decreased. A lower forging temperature is conducive to the formation of crystallites of very small diameter. However, as the temperature is lowered to below about one-half the melting point of the crystal, measure in degrees Centigrade, the ease of formation and propagation of fractures is progressively enhanced.

It will be appreciated that, though, as indicated hereinabove, a deformation ratio of at least 1.5 is required to press-forge an essentially monocrystalline ingot so as to obtain the desired polycrystalline characteristics of the articles of this invention, this ratio may be lower, but greater than one, for press-forging a first optically intergral polycrystalline mass to obtain a second optically intergral polycrystalline mass.

It will also be appreciated that the terms 'restraint' and 'constraint' are used synonymously in the mechanical sense to describe a restriction of the motion of the polycrystalline mass by confining means which serve to restrain the mass from further movement. No reference is intended to ionic forces within either a monocrystalline or polycrystalline mass which may act as restraints on a molecular or microscopic scale.

The following examples serve to illustrate the invention without intending to limit its scope.

EXAMPLE 1

An essentially single crystal cylindrical section of a macrocrystal ingot of sodium iodide doped with about 0.07 weight percent thallium iodide having a diameter of 2" and a length of 6", is sawn from a melt-grown ingot. This cylindrical section is placed on end between graphite-coated support plates of Inconel held between the platens of a 750-ton hydraulic press. The assembly of platens, support plates and crystal is surrounded by an electrically heated furnace to raise the assembly to and maintain it at a desired temperature of about 500° C. The temperature is recorded by a recorder controller in cooperation with a thermocouple inserted in one of the support plates. There is no radial constraint on the cylindrical crystal section. When the assembly reaches the desired temperature, the press is started and commences to descend slowly, flattening the cylindrical crystal. When the support plates are about 1.25" apart, as read on an indicator on the press, the press is shut off, the ram raised and a flat polycrystalline disc 5" in diameter and approximately 1.125" thick is removed from the press. Scintillation tests conducted with the single crystal cylindrical section prior to being press-forged, and the polycrystalline press-forged disc showed that the scintillation properties of each were identical. The following Table is a record of the run.

TABLE I

| Clock Time Hours | Controller Setting °C. | Recorded Temp. of Support Plate °C. | Ram Travel Indicator Reading on Press | Remarks |
|---|---|---|---|---|
| 0830 | 400 | 361 | | |
| 0915 | 500 | 467 | | |
| 1000 | 550 | 510 | | |
| 1030 | 540 | 505 | | |
| 1230 | 535 | 500 | | |
| 1300 | 535 | 500 | 6.00 | Start press-lower ram |
| 1303 | " | " | 5.5 | |
| 1304 | " | " | 5.0 | |
| 1305 | " | " | 4.5 | |
| 1306 | " | " | 3.5 | |
| 1307 | " | " | 3.0 | |
| 1308 | " | " | 2.5 | |
| 1309 | " | " | 2.0 | |
| 1310 | " | " | 1.75 | |
| 1311 | " | " | 1.50 | |
| 1312 | " | " | 1.375 | |
| 1313 | " | " | 1.375 | |
| 1313.5 | " | " | 1.250 | Shut off press |

$$\text{Deformation ratio} = \frac{\text{Initial height of macrocrystal section}}{\text{Final thickness of polycrystalline disc}} = 5.325$$

The disc is completely transparent when the graphite coating has been cleaned off the surfaces. There are no voids in the disc, no incipient fractures, and no discontinuities. The deformation ratio was effected in a time of 13.5 minutes. The central portion of the polycrystalline disc is found to consist of individual crystallites of relatively larger size than those crystallites near the periphery of the disc. An examination of the polycrystalline structure of the disc indicates that the fine grain structure of crystallites near the periphery of the disc are angularly disposed relative to the direction of compression, with a regular orientation in all directions radially, i.e., the grain orientation is not random.

EXAMPLE 2

A female die is centered on the anvil die or bed of a 300-ton hydraulic press. To minimize heat loss, the female die is preferably insulated from the bed with an asbestos sheet. A melt-grown single crystal cylindrical section of an ingot of calcium fluoride 2.5" in diameter×0.75" thick is placed in a bowl-shaped depression of the female die. The surface of the depression matches the exterior surface of a spherical section or dome-shaped window to be press-forged from the cylindrical section. The upper surface of the female die is provided with a groove adapted to snugly accommodate an upstanding cylindrical ring having a bore corresponding to the inside diameter of the female die. A cylindrical male die is provided which may be slidably disposed within the ring and thereafter snugly inserted into the female die. The male die has a convex surface which matches the interior surface of the dome-shaped window to be forged. The convex surface of the male die terminates in a circumferential shoulder, the width of which corresponds to the thickness of the dome-shaped window to be forged. The shoulder prevents material between the dies from being squeezed out. The volume of the cylindrical crystal section corresponds essentially identically with that of the volume of the dome-shaped cavity defined by the male and female dies when they are concentrically disposed so as to form a spherical section of essentially constant thickness defined by the width of the shoulder which provides a finishing restraint.

The female and male die surfaces are preferably coated with graphite, or any suitable release agent, or are covered with graphite cloth impregnated with graphite to prevent sticking of the press-forged crystal within the die assembly. The ring is positioned in the groove on the upper surface of the female die which is centered on the bed of the press. The male die is then lowered through the ring and into the female die so that the apex of the convex surface of the male die rests upon the single crystal cylindrical section.

The die assembly is surrounded by a furnace provided with heating elements of sufficient capacity to raise the temperature of the crystal and the die assembly to a predetermined temperature below the melting point of the crystal but above a temperature at least one-half the melting point of the crystal measured in degrees centigrade. Thermocouples may be affixed to either the male or female die, or both, and are preferably connected to a recorder controller. After the crystal and die assembly have been heated for a sufficient period to reach a temperature of about 730° C., the space within the furnace is flooded with hot nitrogen to reduce contamination of the crystal by the atmosphere. The press is started and the ram carrying the upper forging die of the press commences its downward movement until it rests against the upper surface of the male die. Increasing the load transmitted by the ram causes the male die to squeeze the crystal against the concave surface of the female die. When the indicator on the press indicates that a dome about 0.375" thick has been formed, the press is stopped and the ram lifted. The experimental run is set forth hereinbelow in Table II.

TABLE II

| Hour-Clock Time | Controller Setting C.° | Recorded Temp. of Die, °C. | Indicated Load Reading on Press, Tons | Remarks |
| --- | --- | --- | --- | --- |
| 1030 | 800 | 750 | | |
| 1130 | 800 | 800 | | |
| 1230 | 800 | 775 | | |
| 1243 | 800 | 775 | | Start press |
| 1245 | 800 | 775 | 14 | |
| 1247 | 800 | 780 | 15 | |
| 1249 | 800 | 785 | 17.5 | |
| 1251 | 800 | 790 | 20 | |
| 1253 | 800 | 795 | 25 | |
| 1255 | 800 | 795 | 30 | |
| 1258 | 800 | 800 | 35 | Stop press |
| 1300 | 800 | 800 | | Male die removed from die assembly |

The single crystal is transformed into a polycrystalline dome, the periphery of which is squeezed up unevenly against the shoulder of the male die. Complete transformation of the single crystal to polycrystalline form is accomplished prior to the periphery of the dome being stopped by the shoulder of the male die, as is evidenced by sections near the periphery which did not contact the shoulder. The dome is easily removed from the female die, shows no fractures or voids, and is completely transparent after the graphite is cleaned off the surfaces. The thickness of the dome is not uniform, the center being slightly thicker than the periphery. Thickness is in the range from about 0.3866" in the center to about 0.3575" near the edge. The size of individual crystallites near the center of the polycrystalline dome is substantially larger than those near the periphery, being from about 2 to about 5 times as large. A radial gradation in size is apparent. Orientation of crystallites near the periphery of the dome is in the direction of flow of the polycrystalline material and angularly disposed with respect to the direction of application of the compressive force on the material. The uneven thickness of the dome-shaped spherical sector, due to the press being prematurely stopped, serves to demonstrate that the complete transformation from essentially single crystal to fully dense polycrystalline form is accomplished prior to the imposition of the finishing restraint. It is also noted that the size range of crystallites along the lip of the dome is the same against the restraint as it is where the lip did not abut the restraint.

EXAMPLE 3

The press-forged calcium fluoride polycrystalline dome produced in Example 2 hereinabove, referred to as "unfinished" because of its uneven thickness, is given a 'finished' press-forging as follows: The surfaces of the same die assembly used in the previous Example 2 are brushed with a graphite-based release agent and lubricant, and the unfinished dome positioned between the female and male dies. The same procedure outlined in Example 2 is followed to bring the die assembly and dome to a temperature of about 800° C.; the furnace is flooded with hot nitrogen prior to lowering the ram against the dome; the load on the dome is increased until the ram-position indicator on the press indicates a constant reading. The press is stopped, the ram raised and the die assembly insulated to cool gradually overnight. When the die assembly is disassembled, a finished dome of constant thickness is found to have been produced. The lip of the dome is seen to have abutted the shoulder of the male die uniformly.

In the above finished press-forging of a first polycrystalline mass to form a second polycrystalline mass, it will be apparent the deformation ratio is only slightly greater than unity. Though the deformation ratio in most finishing operations will be greater than 1.0, but less than about 1.5, the limits of the deformation ratio for the press-forging of a polycrystalline, fully dense, optically integral mass are established only by the practical limitations of the physical equipment and the ability to control the operating conditions. In general, it will be found that a deformation ratio of about 10 is the practical limit of most relatively large press-forgings. It will be appreciated that the difficulties encountered with press-forging an article 1" thick from an optically integral relatively large mass 10" thick will be considerably greater than those encountered with an article 1 mm. thick press-forged from an optically integral relatively small mass 10 mm. thick, though the deformation ratio in each case is the same, namely, ten (10). This relative ease of forming relatively small, thin articles, less than about 1" thick, is apparent whether the archetype optically integral mass is polycrystalline or essentially monocrystalline. Similarly, the relative difficulty of utilizing a deformation ratio greater than about 10 for the formation of relatively large, thick articles, equal to or greater than about 1" thick, is also experienced with essentially single crystals to be press-forged into polycrystalline articles. As with polycrystalline articles to be press-forged, the physical equipment and ability to control forging conditions precisely, are the real limitations which determine the upper limit of the deformation ratio in a single crystal to be press-forged. It will be recognized that the lower limit of 1.5 is necessary to effect the transformation of an essentially single crystal, melt-grown ingot, or section thereof, to a polycyrstalline mass. Since, in the case of a first polycyrstalline mass to be press-forged into a second polycrystalline mass, this transformation has already been accomplished, it is sufficient that the deformation ratio be greater than unity.

Other press-forged polycrystalline domes, formed from calcium chloride, calcium bromide, calcium iodide, magnesium fluoride, magnesium chloride, magnesium iodide, magnesium bromide barium fluoride, barium chloride and barium iodide, in a manner analogous to that described in Example 2 hereinabove are likewise finish press-forged as described in this Example 3. Due precautions must be taken to accommodate the particular characteristics of certain halides; for example, highly hygroscopic calcium iodide must be press-forged in a moisture-free environment.

What is claimed is:

1. A shaped, polycrystalline optical body of alkali metal halide or alkaline earth metal halide, composed of crystals oriented with axes in a radial direction, with the crystals in the center portion of said body having an average size substantially larger than the size of the crystals near the periphery thereof, said body having essentially the same optical properties as a single crystal of said halide.

2. A polycrystalline optical body consisting essentially of ionic crystallites selected from an alkali metal halide and an alkaline earth metal halide, said body having optical integrity essentially indistinguishable from that of the starting material, and said crystallites having radially diminishing grain size, the majority of individual crystallites having an orientation radially generally angularly disposed to the force direction said body having no axial grain orientation, and said body having greater strength than a single crystal of said halide.

3. The polycrystalline optical body of claim 2 wherein said optical body is derived from an optically integral polycrystalline extrudate of said single crystal of said halide which includes a dopand.

4. The polycrystalline optical body of claim 3 wherein said dopand is an element selected from Groups I, II, III, IV, V and VII of the Periodic Table, and said element is present in an amount in the range from about 1 part per million to about 10 mole percent.

5. The body of claim 2 forged from a melt-grown optically integral, macrocrystal ingot.

6. The body of claim 5 in which the ingot was press-forged between opposed spaced-apart surfaces to provide a deformation ratio of at least 1.5 without cleaving said macrocrystal at a temperature below its melting point but greater than one-half its melting point measured in degrees Centigrade.

7. The body of claim 6 in which said crystallites are present prior to contact of said body with any radial restraint.

8. The body of claim 5 comprising a window transparent to a laser beam, said window permitting the transmittance of said beam with less than 0.1 percent absorption, or no more absorption than is displayed by said melt-grown ingot.

9. The polycrystalline optical body of claim 8 wherein said melt-grown ingot of said ionic salt includes a dopand.

10. The polycrystalline optical body of claim 9 wherein said dopand is an element selected from Groups I, II, III, IV, V and VII of the Periodic Table, and said element is present in an amount in the range from about 1 part per million to about 10 mole percent.

11. The body of claim 7 which is transparent to ultraviolet radiation shorter than about 1 micron in wavelength.

12. A shaped, polycrystalline body of an alkali metal halide or alkaline earth metal halide transparent to wavelengths in the ultraviolet range and having a sharply defined scatter pattern for a laser beam, said body being composed of crystals oriented with axes in a radial direction, with crystals in the central portion of said body having an average size substantially larger than the size of crystals near said body's periphery.

* * * * *